(12) United States Patent
Park et al.

(10) Patent No.: US 11,791,242 B2
(45) Date of Patent: Oct. 17, 2023

(54) SEMICONDUCTOR DEVICE

(71) Applicant: Samsung Electronics Co., Ltd., Suwon-si (KR)

(72) Inventors: Kwangwuk Park, Seoul (KR);
Youngmin Lee, Hwaseong-si (KR);
Hyoungyol Mun, Yongin-si (KR);
Inyoung Lee, Yongin-si (KR);
Seokhwan Jeong, Suwon-si (KR);
Sungdong Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 168 days.

(21) Appl. No.: 17/371,602

(22) Filed: Jul. 9, 2021

(65) Prior Publication Data
US 2022/0139806 A1    May 5, 2022

(30) Foreign Application Priority Data

Oct. 29, 2020   (KR) ........................ 10-2020-0142012

(51) Int. Cl.
*H01L 23/48*    (2006.01)
*H01L 21/768*    (2006.01)
(Continued)

(52) U.S. Cl.
CPC ...... *H01L 23/481* (2013.01); *H01L 21/76898* (2013.01); *H01L 23/5283* (2013.01);
(Continued)

(58) Field of Classification Search
CPC ............. H01L 23/481; H01L 21/76898; H01L 23/5283; H01L 23/5286; H01L 25/0657;
(Continued)

(56) References Cited

U.S. PATENT DOCUMENTS 9,536,777 B2    1/2017 Lin et al.
9,666,520 B2    5/2017 Yu et al.
(Continued)

FOREIGN PATENT DOCUMENTS

JP           6026756 B2    11/2016

*Primary Examiner* — Herve-Louis Y Assouman
(74) *Attorney, Agent, or Firm* — Harness, Dickey & Pierce, P.L.C.

(57) ABSTRACT

A semiconductor device, includes: a substrate having a first surface on which a plurality of devices are disposed and a second surface, opposite to the first surface; an interlayer insulating film on the first surface of the substrate; an etching delay layer disposed in a region between the substrate and the interlayer insulating film; first and second landing pads on the interlayer insulating film; a first through electrode penetrating through the substrate and the interlayer insulating film; and a second through electrode penetrating the substrate, the etching delay layer, and the interlayer insulating film, the second through electrode having a width, greater than that of the first through electrode, wherein each of the first and second through electrodes includes first and second tapered end portions in the interlayer insulating film, each of first and second tapered end portions having a cross-sectional shape narrowing closer to the landing pads.

20 Claims, 13 Drawing Sheets

(51) Int. Cl.
 *H01L 23/528* (2006.01)
 *H01L 25/065* (2023.01)
 *H01L 23/00* (2006.01)
(52) U.S. Cl.
 CPC ...... *H01L 23/5286* (2013.01); *H01L 25/0657* (2013.01); *H01L 2225/06513* (2013.01); *H01L 2225/06544* (2013.01); *H01L 2225/06586* (2013.01)
(58) Field of Classification Search
 CPC . H01L 2225/06513; H01L 2225/06544; H01L 2225/06586; H01L 24/05; H01L 24/13; H01L 2225/06517; H01L 2225/06541; H01L 2225/06562; H01L 23/49827; H01L 23/485; H01L 23/49838; H01L 24/06; H01L 24/09
 See application file for complete search history.

(56) References Cited

U.S. PATENT DOCUMENTS

| | | |
|---|---|---|
| 9,679,850 B2 | 6/2017 | Chen et al. |
| 9,865,549 B2 | 1/2018 | Shigetoshi |
| 9,997,393 B1 | 6/2018 | Wang et al. |
| 10,269,863 B2 | 4/2019 | Chen et al. |
| 10,535,631 B2 | 1/2020 | Yu et al. |
| 10,600,759 B2 | 3/2020 | Hung et al. |
| 2011/0084385 A1* | 4/2011 | Itaya ................. H01L 24/11 257/737 |
| 2017/0053902 A1* | 2/2017 | Yu ..................... H01L 23/481 |
| 2020/0273780 A1* | 8/2020 | Park ................... H01L 23/481 |

* cited by examiner

SEMICONDUCTOR DEVICE

CROSS-REFERENCE TO RELATED APPLICATION(S)

This application claims benefit of priority to Korean Patent Application No. 10-2020-0142012 filed on Oct. 29, 2020 in the Korean Intellectual Property Office, the disclosure of which is incorporated herein by reference in its entirety.

BACKGROUND

Inventive concepts relates to a semiconductor device.

As the development of 3-dimensional (3D) packages in which a plurality of semiconductor chips are mounted in a single semiconductor package is undertaken, a technology of forming a through electrode such as a through silicon via (TSV) structure forming an electrical connection vertically by penetrating through a substrate or die, is recognized as being significant. In order to improve the performance and reliability of a 3D package, development of a technology for forming a through electrode having excellent reliability and/or reproducibility is required.

SUMMARY

Some example embodiments of inventive concepts provide a semiconductor device including through electrodes having different critical dimensions (CD).

According to some example embodiments of inventive concepts, a semiconductor device includes a substrate having a first surface and a second surface, opposite to the first surface, a plurality of circuits on the first surface, an interlayer insulating film on the first surface of the substrate, an etching delay layer in a region between the first surface of the substrate and the interlayer insulating film, first and second landing pads on the interlayer insulating film, a first through electrode penetrating the substrate and the interlayer insulating film, and connected to the first landing pad, and a second through electrode penetrating the substrate, the etching delay layer, and the interlayer insulating film, and connected to the second landing pad, the second through electrode having a width greater than a width of the first through electrode. The first and second through electrodes respectively comprise first and second tapered end portions in the interlayer insulating film, and each of the first and second tapered end portions has a cross-sectional shape narrowing closer to the respective ones of the first and second landing pads.

According to some example embodiments of inventive concepts, a semiconductor device includes a substrate having an upper surface on which a plurality of circuits are arranged, an etching delay layer on the substrate, an interlayer insulating film on the substrate, first and second landing pads on the interlayer insulating film, a first through electrode penetrating the substrate and the interlayer insulating film and connected to the first landing pad, a first electrode insulating film surrounding a sidewall of a portion of the first through electrode that excludes a first tapered end portion, the first tapered end portion in the interlayer insulating film and adjacent to the first landing pad, a second through electrode penetrating through the substrate, the etching delay layer, and the interlayer insulating film, and connected to the second landing pad, the second through electrode having a width greater than or equal to 30% of the first through electrode, and a second electrode insulating film surrounding a sidewall of a portion of the second through electrode excluding a second tapered end portion, the second tapered end portion in the interlayer insulating film adjacent to the second landing pad. A difference in levels between an upper end of the first electrode insulating film and an upper end of the second electrode insulating film is 0.5 μm or less.

According to some example embodiments of inventive concepts, a semiconductor device includes a substrate, a first etching delay layer on one region of the substrate, an interlayer insulating film on the substrate, a second etching delay layer in the interlayer insulating film, first to third landing pads on the interlayer insulating film, a first through electrode penetrating the substrate and the interlayer insulating film and connected to the first landing pad, a second through electrode penetrating the substrate, any one of the first and second etching delay layers, and the interlayer insulating film, and connected to the second landing pad, the second through electrode having a width greater than the width of the first through electrode, and a third through electrode penetrating the substrate, the first and second etching delay layers, and the interlayer insulating film, and connected to the third landing pad, the third through electrode having a width greater than the width of the second through electrode. The first to third through electrodes respectively comprise first to third tapered end portions positioned in the interlayer insulating film and each of first to third tapered end portions has a cross-sectional shape narrowing closer to respective ones of the first to third landing pads.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION OF SOME EXAMPLE EMBODIMENTS

Hereinafter, embodiments of inventive concepts will be described as follows with reference to the accompanying drawings.

Figure 1:
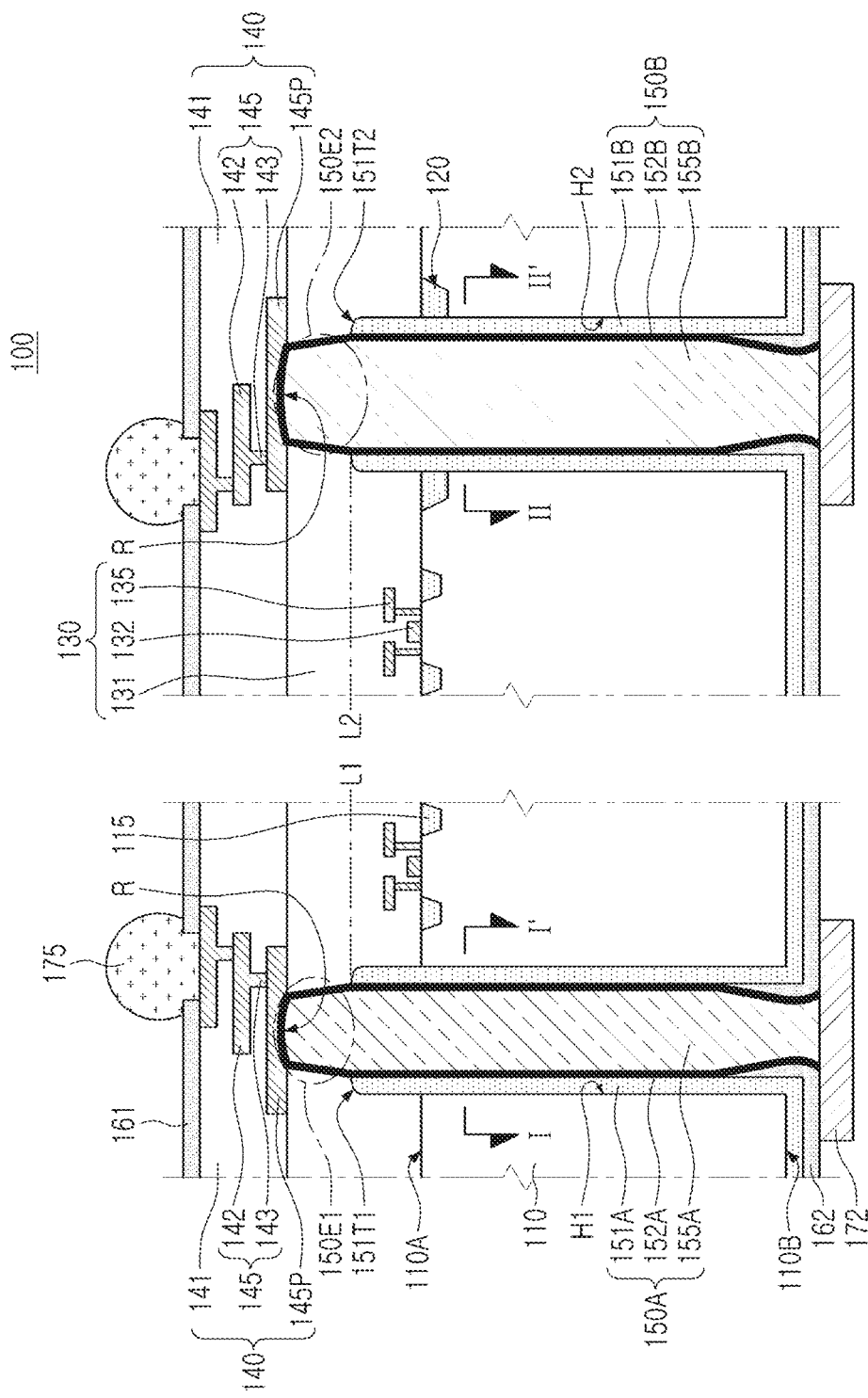
FIG. 1 is a cross-sectional view illustrating a semiconductor device according to some example embodiments of inventive concepts.
Figure 2:
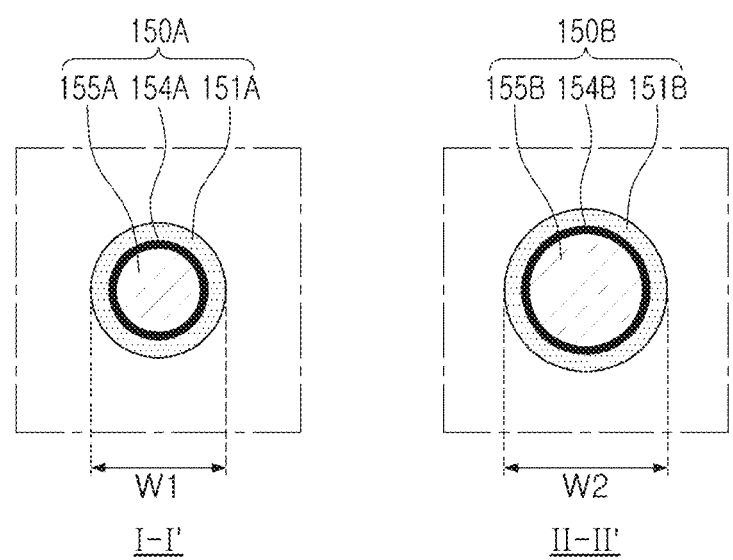
FIG. 2 is a partial plan view taken along lines I-I' and II-II' of FIG. 1.

FIG. 1 is a cross-sectional view illustrating a semiconductor device according to some example embodiments of inventive concepts, and FIG. 2 is a partial plan view taken along lines I-I' and II-II' of FIG. 1.

Referring to FIG. 1, a semiconductor device 100 according to some example embodiments includes a substrate 110, a front-end-of-line (FEOL) structure 130, a back-end-of-line (BEOL) structure 140, and first and second through electrodes 150A and 150B.

The substrate 110 has or includes or corresponds to a semiconductor substrate such as wafer or a portion of a wafer or a diced portion of a wafer or a chip having a first surface 110A having an active region and a second surface 110B disposed opposite to the first surface 110A. For example, the substrate 110 may include a semiconductor such as at least one of silicon (Si), and germanium (Ge), or a compound semiconductor such as silicon carbide (SiC), gallium arsenide (GaAs), indium arsenide (InAs), and indium phosphide (InP). In some example embodiments, the substrate 110 may include a silicon on insulator (SOI) structure or a buried oxide layer (BOX), and may be undoped or lightly doped, and further may be formed of single-crystal material and/or polycrystalline material. The active region of the substrate 110 may include a well doped with p-type impurities such as boron or n-type impurities such as phosphorus or arsenic. In addition, the substrate 110 may have a device isolation film 115 such as a shallow trench isolation (STI) structure and/or a local oxidation of silicon (LOCOS) structure.

The FEOL structure 130 may include a plurality of individual devices 135 disposed in an active region of the substrate 110, an interlayer insulating film 131 disposed on the first surface 110A of the substrate 110, and a wiring layer 132 connected to the plurality of individual devices 135. For example, the interlayer insulating film 131 may include at least one of silicon oxide, silicon nitride, silicon oxynitride, or a low dielectric material having a lower dielectric constant than silicon oxide. In some example embodiments, the interlayer insulating film 131 may be or may include a silicon oxide such as phosphor silicate glass (PSG), borophosphor silicate glass (BPSG), undoped silicate glass (USG), tetra ethyl ortho silicate (TEOS), plasma enhanced-TEOS (PE-TEOS), and a high density plasma-chemical vapor deposition (HDP-CVD) oxide. The plurality of individual devices 135 may include various microelectronic devices, for example, at least one of a MOSFET, a system large scale integration (LSI), an image sensor such as a CMOS imaging sensor (CIS), a micro-electro-mechanical system (MEMS), an active device such as a diode and/or a transistor, a passive device such as a resistor and/or a capacitor and/or an inductor and/or a memristor, or the like.

These individual devices 135 or circuits may constitute/correspond to the semiconductor device 100 having a specific function. The semiconductor device 100 may be or may include a memory device such as volatile and/or non-volatile memory devices, and/or a logic element. The volatile memory device may include at least one of a dynamic random access memory (DRAM), a static RAM (SRAM), a thyristor RAM (TRAM), or the like. In addition, the non-volatile memory device may include, for example, at least one of a flash memory, a magnetic RAM (MRAM), a spin-transfer torque MRAM (STT-MRAM), a ferroelectric RAM (FRAM), a phase change RAM (PRAM), or a resistive RAM (RRAM). The logic device may be implemented as, for example, at least one of a microprocessor, a graphics processor, a signal processor, a network processor, a chipset, an audio codec, a video codec, an application processor, a system on chip, or the like, but is not limited thereto.

The BEOL structure 140 may include an intermetallic insulating layer 141 disposed on the FEOL structure 130, and a multilayer wiring structure 145 comprising a plurality of metal wiring layers 142 and a plurality of metal vias 144. The multilayer wiring structure 145 may be connected to the wiring layer 132 of the FEOL structure 130 and the first and second through electrodes 150A and 150B. For example, the intermetallic insulating layer 141 may include a low dielectric material.

The first and second through electrodes 150A and 150B may penetrate, e.g. fully extend, through the substrate 110 and the interlayer insulating film 131 and may be respectively connected to landing pads 145P of the multilayer wiring structure 145. The first and second through electrodes 150A and 150B may be configured as a path for transmitting and/or receiving a signal from an external pad 172 and/or transmitting power from the external pad 172.

The first and second through electrodes 150A and 150B may include first and second electrode insulating films 151A and 151B, first and second conductive barriers 152A and 152B, and first and second conductive plugs 155A and 155B, respectively. The first and second through electrodes 150A and 150B may be disposed inside first and second through-holes H1 and H2 penetrating through the substrate 110 and the interlayer insulating film 131. The first and second through-holes H1 and H2 may extend in a vertical direction from the second surface 110B of the substrate 110 to the first surface 110A. The first and second electrode insulating films 151A and 151B, the first and second conductive barriers 152A and 152B, and the first and second conductive plugs 155A and 155B may be sequentially disposed on inner walls of the first and second through-holes H1 and H2.

In some example embodiments, the first and second through electrodes 150A and 150B may have different critical dimensions (CD), particularly different widths (e.g. different diameters). As shown in FIG. 2, the second through electrode 150B may have a second width W2, wider than the first width W1 of the first through electrode 150A. The difference in width may be determined according to characteristics (e.g., resistance and/or capacitance) required/desired according to a role of the through electrode. For example, the first through electrode 150A may be provided as a signal line for transmitting and/or receiving a signal from the external pad 172, while the second through electrode 150B may be provided as a power line for transmitting power to the external pad 172. For example, although not limited thereto, a width W2 of the second through electrode 150B may be at least 1 μm, and further, at least 1.5 μm greater than the width W1 of the first through electrode 150A. In another aspect, the width W2 of the second through electrode 150B may be 20% or more, and further, 30% or more greater than the width W1 of the first through electrode 150A.

The semiconductor device 100 according to some example embodiments may include an etching delay layer 120 disposed in a region between the first surface 110A of the substrate 110 and the interlayer insulating film 131. (See also FIG. 6). The etching delay layer 120 may be disposed in a region penetrating through the second through electrode 150B. The first through electrode 150A may penetrate through the substrate 110 and the interlayer insulating film 131 and may be connected to the landing pad 145P, while the second through electrode 150A having a relatively large width may additionally penetrate through the etching delay layer 120 together with the substrate 110 and the interlayer insulating film 131 and may be connected to the landing pad 145P.

Due to the difference in widths of the first and second through electrodes 150A and 150B, a difference in depths between the first and second through-holes H1 and H2 formed under the same etching condition (primary etching process) may occur. For example, the second through-hole H2 may have a depth greater than the depth of the first through-hole H1, and a defect in which the landing pad 145P is opened, e.g. fully opened, by the second through-hole H2 may occur in a process of forming the first through-hole H1 to the landing pad 145P. A difference in etching depths that may occur due to the difference in widths between the first and second through-holes H1 and H2 may be reduced by introduction of an etching delay layer 120 disposed in a region in which the second through-hole H2 is formed, and not in a region in which the first through-hole H2 is formed.

The etching delay layer 120 may surround a part of an outer sidewall of the second through electrode 150B, and may not surround a part of an outer sidewall of the first through electrode 150A. The etching delay layer 120 employed in some example embodiments may be disposed in the substrate 110, and an upper surface of the etching delay layer 120 may form substantially the same plane as the upper surface of the substrate 110 The upper surface of the etching delay layer 120 may be in contact with a lower surface of the interlayer insulating film 131. The etching delay layer 120 may include a material having an etching rate lower than that of the material of the substrate 110. For example, the etching delay layer 120 may include at least one of a dielectric material, a semiconductor material (e.g., SiGe), and/or a metal material (e.g., tungsten). The dielectric material may be at least one of silicon oxide, silicon nitride, silicon oxynitride, silicon carbonitride, and silicon oxycarbonitride.

In some example embodiments, the etching delay layer 120 may include, e.g. may consist of, the same material as the material of other components disposed at the corresponding level. For example, the substrate 110 may include a device isolation film 115 disposed between the plurality of individual devices 135, and the etching delay layer 120 may include, e.g. may consist of, the same material as the device isolation film 110 (e.g., $SiO_2$). The etching delay layer 120 and the device isolation film 115 may be formed at the same time; however, example embodiments are not limited thereto. A thickness of the etching delay layer 120 may be greater than a thickness of the device isolation film 110; however, example embodiments are not limited thereto.

The etching delay layer 120 is illustrated to have a quadrangular shape such as a square shape, but is not limited thereto, and may have other polygonal, circular, or elliptical shapes.

Each of the first and second through electrodes 150A and 150B may include first and second tapered end portions 150E1 and 150E2 disposed in the interlayer insulating film 131. Each of the first and second tapered end portions 150E1 and 150E2 may have a cross-sectional shape narrowing closer to the landing pads 145P. Points L1 and L2 at which the first and second tapered end portions 150E1 and 150E2 start may be understood as regions obtained by a primary etching (see FIG. 9). As described above, the etching delay layer 120 selectively disposed on the second through electrode 150B may affect an etching rate and may reduce a difference in etching depth according to the widths of the first and second through electrodes 150A and 150B.

Depending on the etching rate of the material constituting or included in the etching delay layer 120, a degree of delay of the second through-hole formation time (for example, a deviation of the points L1 and L2 at which the first and second tapered end portions 150E1 and 150E2 start) may be adjusted. Alternatively or additionally, the degree of delay may also be adjusted according to the thickness of the etching delay layer 120.

In some example embodiments, the points L1 and L2 at which the first and second tapered end portions 150E1 and 150E2 start in each of the first and second through electrodes 150A and 150B may be disposed on substantially the same level.

The structures of the first and second tapered end portions 150E1 and 150E2 may be determined by end portion regions of first and second conductive plugs 155A and 155B, respectively. The first and second conductive plugs 155A and 155B may be formed of, e.g. may consist of or may include, the same material. For example, the first and second conductive plugs 155A and 155B may be formed of or include at least one of Cu, CuSn, CuMg, CuNi, CuZn, CuPd, CuAu, CuRe, CuW, W, or a W alloy, but are limited thereto. Similar to the first and second through electrodes 150A and 150B, the second conductive plug 155B may have a width greater than that of the first conductive plug 155A.

In some example embodiments, the first and second conductive plugs 155A and 155B may extend from the second surface 110B of the substrate 110 through the first surface 110A. As shown in FIG. 1, upper ends of the first and second conductive plugs 155A and 155B may be disposed at a level higher than the upper surface of the interlayer insulating film 131. For example, the landing pad 145P may be somewhat recessed in a region R, in contact with the first and second conductive plugs 155A and 155B.

The first and second conductive plugs 155A and 155B may be surrounded by first and second conductive barriers 151A and 151B, respectively. For example, the first and second conductive barriers 151A and 151B may include a single layer or multiple layers including at least one material selected from W, WN, WC, Ti, TiN, Ta, TaN, Ru, Co, Mn, WN, Ni, or NiB. Alternatively or additionally, in some example embodiments, the first and second conductive barriers 151A and 151B may be formed by at least one of a Physical Vapor Deposition (PVD) process or a CVD process, or an Atomic Layer Deposition (ALD) process. In some example embodiments, either or both of the first and second conductive plugs 155A and 155B may have a shape of an Egyptian cartouche or of a fish in cross-sectional view.

First and second electrode insulating films 151A and 151B may function as an insulating spacer preventing, or reducing the likelihood of, direct contact between the conductive material included in the first and second through electrodes 150A and 150B and the substrate 110. The first and second electrode insulating films 151A and 151B may be disposed to be spaced apart so as not to contact the landing pad 145P. The first electrode insulating film 151A may be disposed between the first through electrodes 150A, and the substrate 110 and the interlayer insulating film 120. Similarly, the second electrode insulating film 151B may be disposed between the second through electrode 150B, and the substrate 110 and the interlayer insulating film 120 The first and second electrode insulating films 151A and 151B may surround sidewall regions of the first and second conductive plugs 155A and 155B in a region excluding the first and second tapered end portions 150E1 and 150E2, respectively. Either or both of the first and second electrode insulating films 151A and 151B may be disposed only in a portion of inner wall of the first and second through-holes H1 and H2 obtained by primary etching (see FIGS. 8 and 9). Either or both of the first and second electrode insulating films 151A and 151B may not be disposed on each surface of the first and second tapered end portions 150E1 and 150E2.

The points L1 and L2 at which the first and second tapered end portions 150E1 and 150E2, described above, start may be expressed as a level of upper ends 151T1 and 151T2 of the first and second electrode insulating films 151A and 151B, respectively. In some example embodiments, the upper end 151T1 of the first electrode insulating film and the upper end 151T2 of the second electrode insulating film 151T2 may be the same or substantially the same.

For example, the first and second electrode insulating films 151A and 151B may be formed of, e.g. consist of or include, silicon oxide, silicon nitride, silicon carbide, polymer, or a combination thereof. In some example embodiments, either or both of the first and second electrode insulating films 151A and 151B may be formed by at least one of an Atomic Layer Deposition (ALD) process or a Chemical Vapor Deposition (CVD) process. The first and second electrode insulating films 151A and 151B may have a thickness of about 500 Å to about 3000 Å, but is not limited thereto.

In some example embodiments, the first and second electrode insulating films 151A and 151B may have, e.g. may consist of or include, the same material and/or may have substantially the same thickness. Similarly thereto, the first and second conductive barriers 152A and 152B may have the same material and substantially the same thickness.

An upper insulating film 161 may be disposed on an upper surface of the BEOL structure 140. The upper insulating film 161 may be disposed on the upper surface of the BEOL structure 140. The upper insulating film 161 may expose a portion of pad regions on an intermetallic insulating film 141. A bump structure 175 may be disposed in the exposed pad region. For example, the upper insulating film 161 may include polyimide such as photosensitive polyimide and/or silicon nitride, but is not limited thereto. In some example embodiments, the bump structure 175 may include a pillar and/or a solder layer. For example, the pillar may be formed by an electroplating process using at least one of Cu, Ni, or alloys thereof. The solder layer may be formed by sequentially performing an electroplating process and a reflow process using at least one of Sn, Ag, Pb, Au, Cu, B, or alloys thereof.

Unlike the first surface 110A, a second surface 110B of the substrate 110 may be or correspond to an inactive surface. A protective insulating film 162 may be disposed on the second surface 110B of the substrate 110. The protective insulating film 162 may have a portion extending to some regions between the first conductive plug 155A and the first electrode insulating film 151A and to some regions between the second conductive plug 155B and the second electrode insulating film 151B. The protective insulating film 162 may be used as an etching buffer layer capable of maintaining profiles of the first and second through-holes H1 and H2 in the second etching process (see FIG. 9). The protective insulating film 162 may be formed of or include a silicon oxide layer, a silicon nitride layer, a polymer, or a combination thereof. In some example embodiments, the passivation portion and the extended buffer portion disposed on the second surface 110B of the substrate 110 may be formed of a different material.

An external pad 172 connected to the first and second through electrodes 150A and 150B may be disposed on the second surface 110B (in particular, the protective insulating film 162) of the substrate 110. The external pad 172 may include Al, Ni, Cu, or a combination thereof, but is not limited thereto.

As described above, the first and second through electrodes 150A and 150B employed in some example embodiments may penetrate through the substrate 110 and the interlayer insulating film 131 to be electrically connected to the landing pad 145P. Specifically, a region of the first and second through electrodes 150A and 150B, adjacent to the landing pad 145P, has first and second tapered end portions 150E1 and 150E2. The first and second electrode insulating films 151A and 151B are not disposed in the first and second tapered end portions 150E1 and 150E2 so as not to contact the landing pad 145P. The protective insulating film 162 has a portion extending to some regions in the through-holes H1 and H2 adjacent to the second surface 110A of the substrate 110. Alternatively or additionally, a surface of the landing pad 145P, in contact with the first and second through electrodes 150A and 150B, may have a somewhat recessed region R.

These structural features will be described later, but in a method of manufacturing/fabricating the semiconductor device 100 according to inventive concepts (see FIGS. 6 to 10), a method in which a landing pad 145P and an interlayer insulating film 141 are first formed on the first surface 110A of the substrate 110, and first and second through electrodes 150A and 150B are then formed, a so-called 'via last' method may be used. In general, a method of forming the first and second through electrodes 150A and 150B may include so-called "via first" and "via middle" methods in addition to or alternative to the via last method. The via first method refers to a method of forming a through electrode before an integrated circuit of a semiconductor device is formed, and the via middle method refers to a method of forming a through electrode before forming a multilayer wiring structure after forming an integrated circuit of a semiconductor device.

Figure 3:
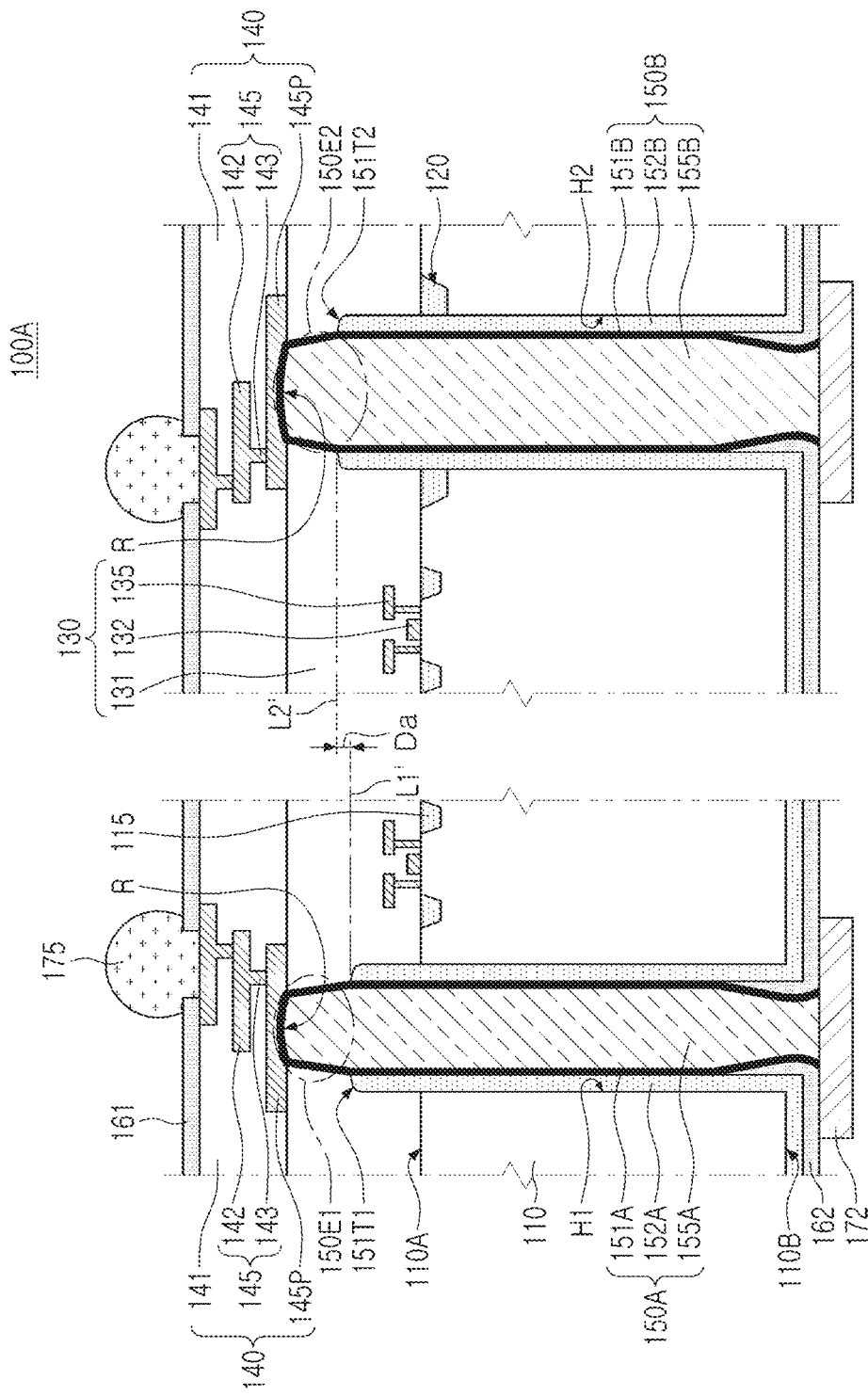
FIG. 3 is a cross-sectional view illustrating a semiconductor device according to some example embodiments of inventive concepts.
Figure 4:
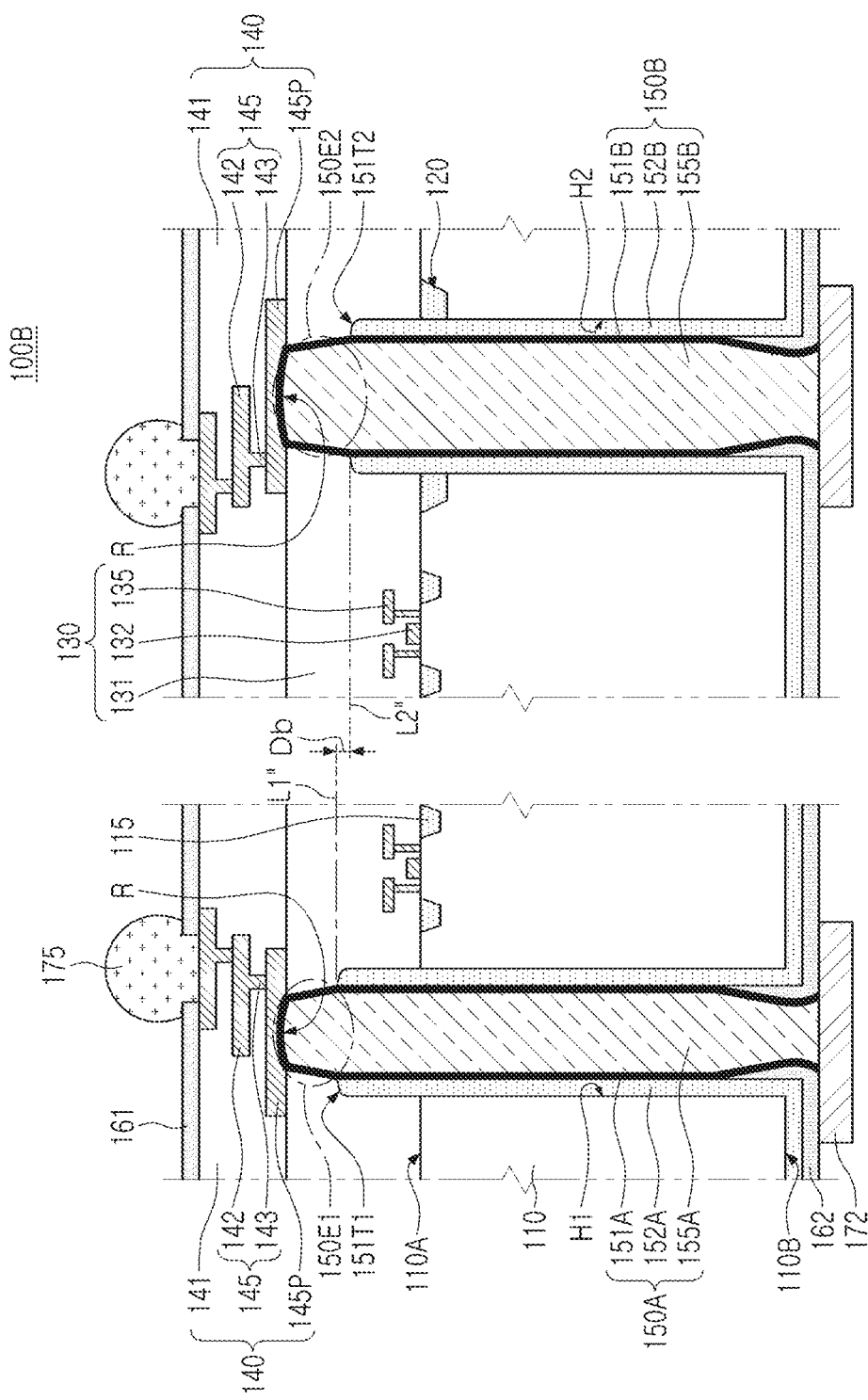
FIG. 4 is a cross-sectional view illustrating a semiconductor device according to some example embodiments of inventive concepts.

FIGS. 3 and 4 are cross-sectional views illustrating a semiconductor device according to various example embodiments of inventive concepts.

Referring to FIGS. 3 and 4, the semiconductor devices 100A and 100B according to some example embodiments can be understood as a structure, similar to the semiconductor device 100 illustrated in FIGS. 1 and 2 except that the first and second tapered end portions 150E1 and 150E2 of the first and second through electrodes 150A and 150B have different levels. Components of some example embodiments may be understood with reference to descriptions of the same or similar components of the semiconductor device 100 shown in FIGS. 1 and 2 unless otherwise specified.

First, referring to FIG. 3, a point L2' at which the second tapered end portion 150E2 of the second through electrode 150B starts may still be somewhat higher than a point at which the first tapered end portion 150E1 of the first through electrodes 150A. However, in the semiconductor device 100A according to some example embodiments, the difference between the two levels L1' and L2' by the etching delay layer 120 disposed on the second through electrode 150B having a relatively large diameter/width (Da) can be reduced to a level that can solve or reduce the impact of a disadvantageous phenomenon such as pad open defects in a secondary etching process. For example, the difference Da between the two levels may be reduced to 0.5 μm or less, and further to 0.3 μm or less.

As described above, the difference in levels Da may be adjusted according to the type and/or thickness of the material constituting the etching delay layer 120. For example, the greater the difference (ER1<ER2) between an etching rate ER1 of the etching delay layer 120 and an etching rate ER2 of the surrounding material at a level corresponding thereto may be, the greater the influence of the etching delay layer 120 by the etching delay layer 120 may be. Alternatively or additionally, the thicker the etching delay layer 120 is, the greater the influence of the etch delay layer 120 may be. By appropriately determining the thickness of the etching delay layer 120 according to the material constituting/included in the etching delay layer 120, the difference Da between the two levels L1 and L2 can be managed in an appropriate range.

Depending on the condition of the etching delay layer 120, contrary to some example embodiments, a point at which the first tapered end portion 150E1 starts in the first through electrode 150A may also be disposed at a higher level than the point at which the second tapered end portion 150E2 starts in the second through electrode 150B.

In the semiconductor device 100B illustrated in FIG. 4, the level L1" at the point at which the first tapered end portion 150E1 starts may also be disposed higher with a certain difference (Db) than the level L2" at the point at which the second tapered end portion 150E2 starts. Even in this case, the difference Db between the two levels L1" and L2" may be reduced to an appropriate level so as not to cause or to reduce the likelihood of causing a disadvantageous phenomenon in the secondary etching process. For example, the difference Db between the two levels may be reduced to 0.5 μm or less, and further to 0.3 μm or less.

In some example embodiments, when the etching delay layer 120 is formed of the same material as the material of other constituent devices disposed at a level corresponding thereto, selection of the type and thickness of the material may be somewhat limited. For example, the substrate 110 may include a device isolation film 115 disposed between the plurality of individual devices 135, and the etching delay layer 120 may include or consist of the same material (e.g., $SiO_2$) as the device isolation film 110, and can be formed to a similar thickness. Even if the etching stop layer under these limited conditions is insufficient to resolve the difference in levels, a sufficient effect can be expected in terms of alleviating or reducing the impact of the difference thereof.

Some example embodiments may provide an additional method to increase an improvement effect of a difference in level while accommodating these limited conditions. Specifically, etching delay layers may be replaced with or additionally introduced with an etching delay layer at another location through which some through-holes pass. These example embodiments will be described later with reference to FIGS. 11 to 13.

Figure 5:
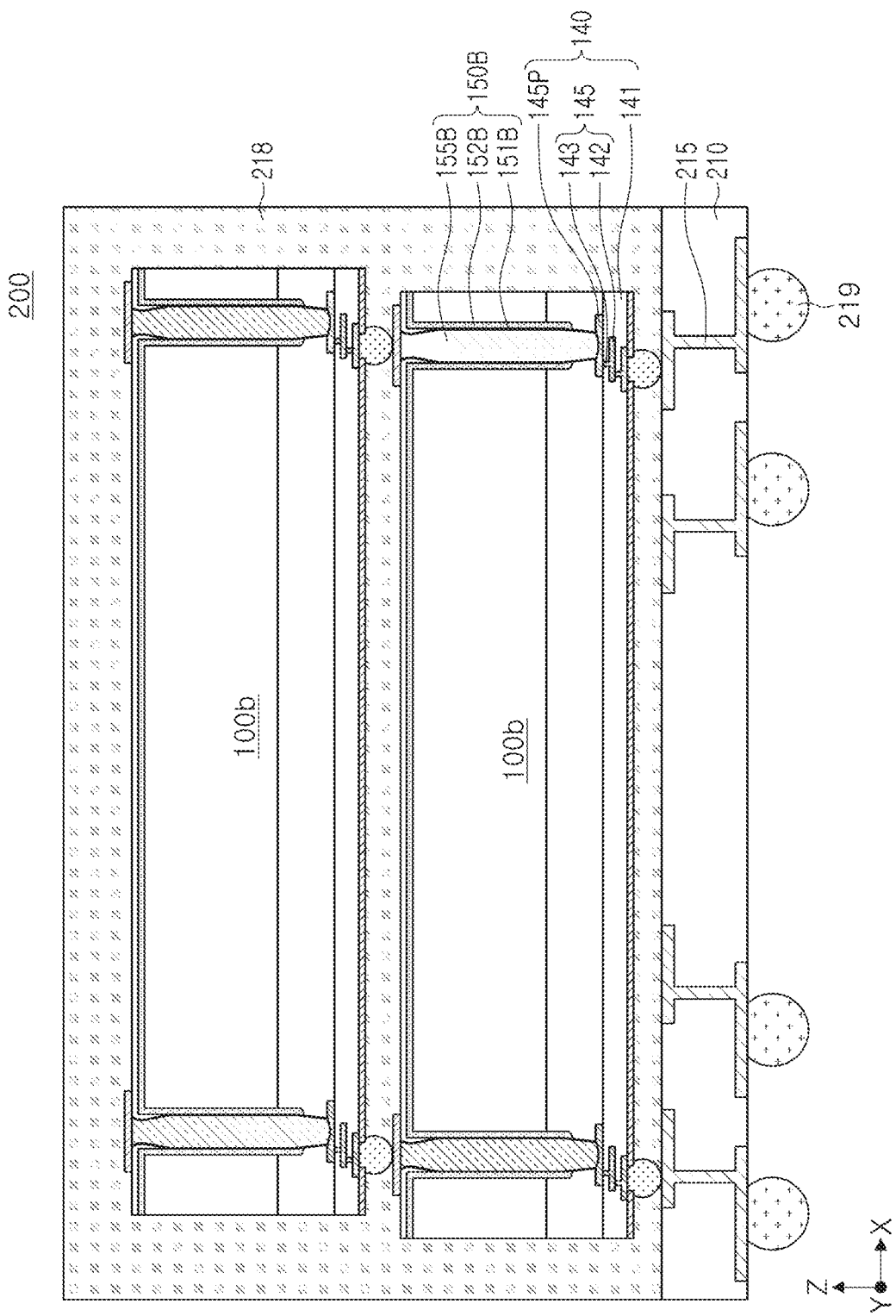
FIG. 5 is a cross-sectional view illustrating a semiconductor device according to some example embodiments of inventive concepts.

FIG. 5 is a cross-sectional view illustrating a semiconductor package according to some example embodiments of inventive concepts.

Referring to FIG. 5, the semiconductor package 200 according to some example embodiments may include a package substrate 210, and at least one of semiconductor device 100a and 100b mounted on the package substrate 210.

In some example embodiments, the package substrate 210 may be a printed circuit board with a wiring structure 215 disposed therein. It is illustrated that the semiconductor devices 100a and 100b illustrated in FIG. 5 are stacked in a vertical direction, but inventive concepts is not limited thereto, and various numbers of semiconductor devices 100a and 100b may be mounted on the package substrate 210 not only in a vertical direction (e.g., Z direction), but also in a horizontal direction (e.g., X direction or Y direction).

In FIG. 5, for convenience, it is illustrated that some components of the semiconductor devices 100a and 100b are omitted or simplified, but in inventive concepts, the at least one semiconductor device 100a and 100b may be or correspond to or include at least one of semiconductor devices 100, 100A, 100B, 100C, 100D, and 100E illustrated in FIGS. 1 to 4 and FIGS. 11 to 13.

A plurality of connection terminals 219 connected to the internal wiring structure 215 for electrical connection with the outside may be formed on a package substrate 210. In some example embodiments, the plurality of connection terminals 219 may be formed of, e.g. may consist of or include, solder balls, but are not limited thereto.

An electrical connection between the package substrate 210 and the semiconductor device 100a, and/or an electrical connection between two adjacent semiconductor devices 100a and 100b may be performed by first and second through electrodes formed in the semiconductor devices 100a and 100b through first and second through electrodes 150A and 150B. The first and second through electrodes 150A and 150B may include first and second tapered end portions disposed at approximately the same level, and may include conductive plugs 155A and 155B, conductive barriers 152A and 152B surrounding the conductive plug 155A and 155B, and electrode insulating films 151A and 151B surrounding the conductive barriers 152A and 152B except for the first and second tapered end portions.

The semiconductor package 200 according to some example embodiments may include a molding film 1220 disposed on the package substrate 210 to mold the semiconductor devices 100a and 100b. In some example embodiments, the molding film 1220 may be made of, e.g. may consist of or include, a polymer. For example, the molding film 1220 may include an epoxy molding compound (EMC).

FIGS. 6 to 10 are cross-sectional views of some major processes for explaining a method of manufacturing/fabricating a semiconductor device according to some example embodiments of inventive concepts.

Figure 6:
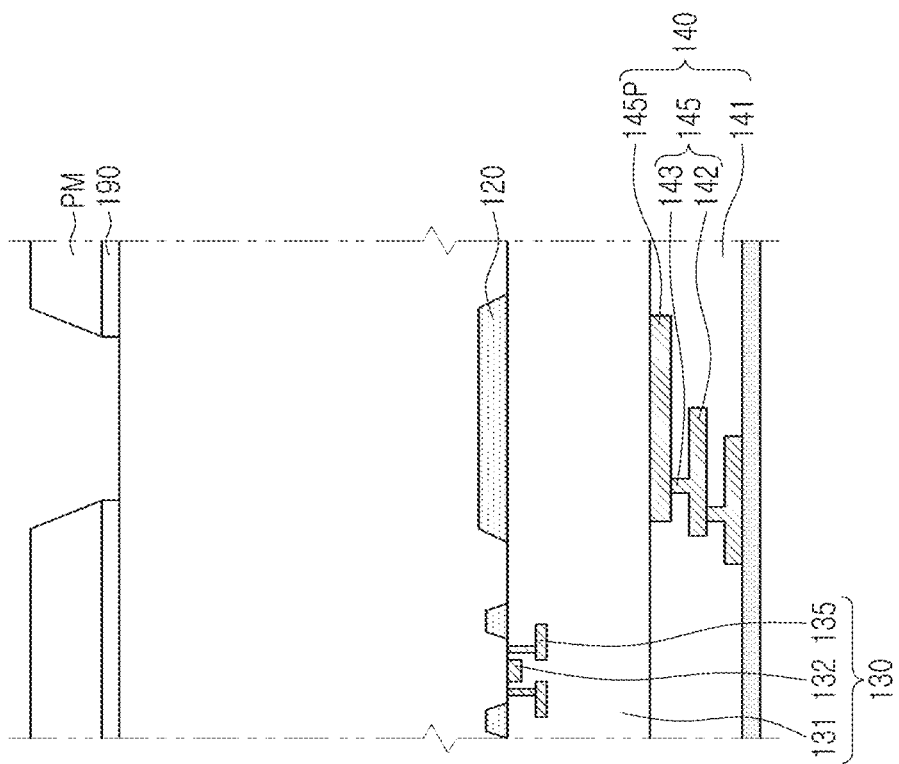
FIGS. 6 to 10 are cross-sectional views of major processes for explaining a method of manufacturing a semiconductor device according to some example embodiments of inventive concepts.
Figure 6:
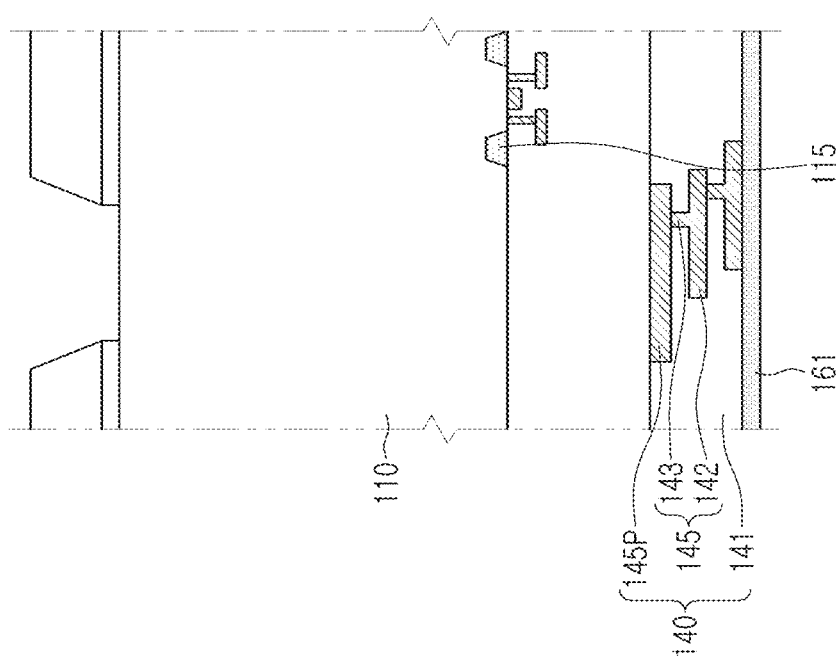

Referring to FIG. 6, a plurality of individual devices 135 of various shapes may be formed on a first surface 110A of a substrate 110. A FEOL structure 130 including the interlayer insulating layer 131 and the wiring layer 135 may be formed on the first surface 110A of the substrate 110. An etching delay layer 120 may be formed between the first surface of the substrate 110 and the interlayer insulating layer 131. The etching delay layer 120 may be formed together with, e.g. simultaneously with, a process of forming a device isolation film 115 such as an STI structure on the substrate 110. In this case, the etching delay layer 120 may include (e.g. may consist of) the same material as the device isolation film 115. Due, for example, to loading effects, there may be a difference depending on a difference in widths of the etching delay layer 120 and the device isolation film 115, but the etching delay layer 120 and the device isolation film 115 may have the same or similar depth. In some example embodiments, inventive concepts are not limited thereto, and the etching delay layer 120 may also be formed by a process that is independent of, e.g. before and/or after, a process of forming the device isolation film.

A mask pattern PM may be formed on a second surface 110B of the substrate 110, and first and second openings O1 and O2 may be formed such that a partial region of the second surface 110B of the substrate 110 is exposed to the mask pattern PM. The first and second opening O1 and O2 may defined a region for forming first and second through-holes for the first and second through electrodes, respectively. The second opening O2 may have a width/diameter smaller than that of the first opening O1. The first and second openings O1 and O2 may be formed in a position overlapping a region of a landing pad 145P in the vertical direction. Here, the landing pad 145P may be a part of a multilayer wiring structure 145 of a BEOL structure 140. In particular, the second opening O2 having a relatively large width may be disposed in a region corresponding to the etching delay layer 120. The mask pattern PM may be or may include a photoresist film, and may have an insulating film pattern 190 such as an oxide film below the mask pattern PM. In some example embodiments, a process applied before a bump structure 175 is formed, is illustrated, but inventive concepts is not limited thereto, and in some example embodiments, it may be performed after the formation of the bump structure 175.

Figure 7:
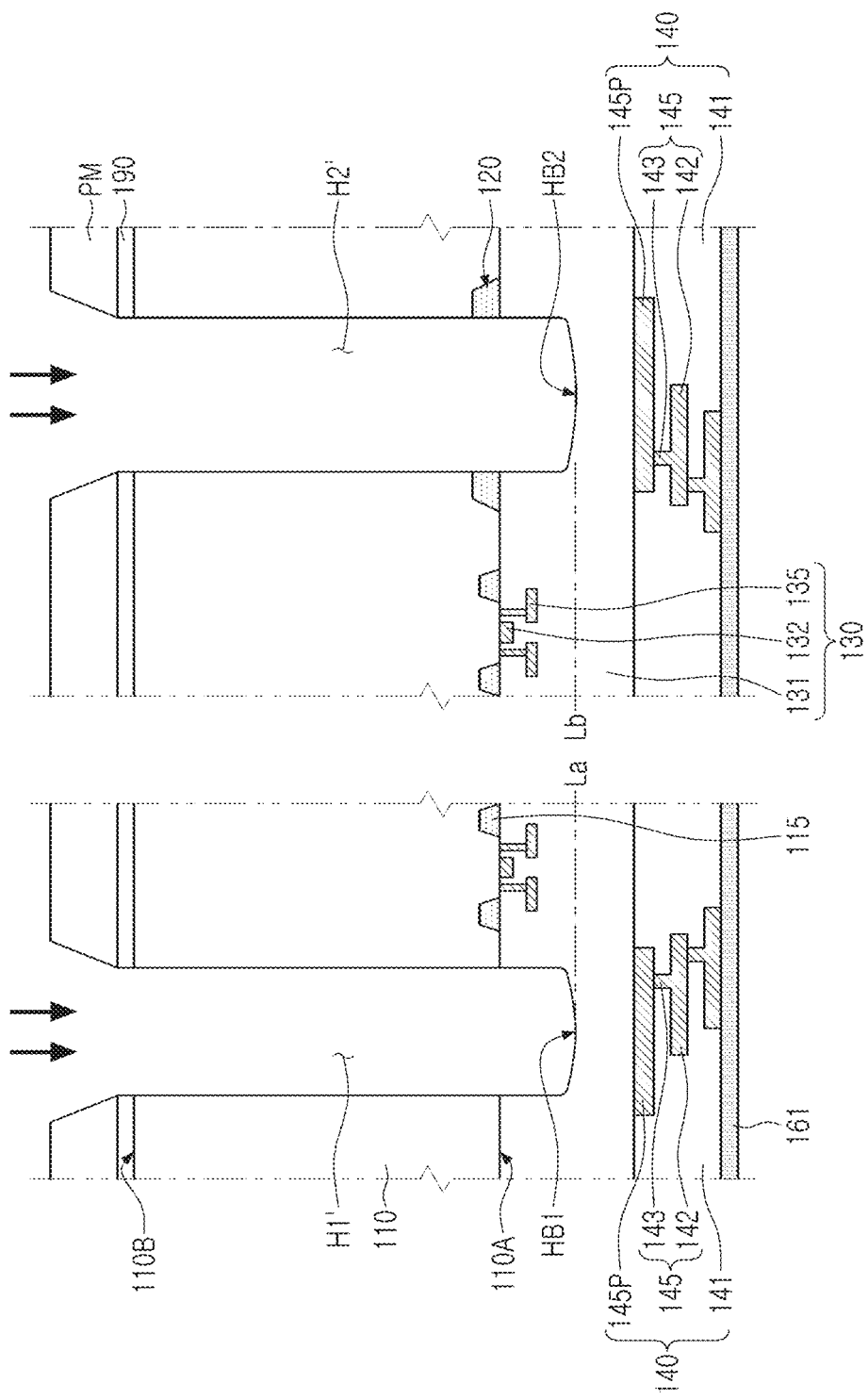

Subsequently, referring to FIG. 7, first and second preliminary through-holes H1' and H2' may be formed by performing a first etching process of etching the substrate 110 using the mask pattern PM.

The first etching process may be performed at a relatively higher etching rate for the substrate 110 (e.g., Si) than other components (e.g., the interlayer insulating film 131). The first and second preliminary through-holes H1' and H2' may not completely penetrate through the interlayer insulating film 131 while penetrating through the substrate 110. For example, bottoms HB1 and HB2 of the first and second preliminary through-holes H1' and H2' may be disposed in the interlayer insulating film 131. As described above, in the first etching process, the second preliminary through-hole H2' having a relatively large width may be formed at a faster speed than the first preliminary through-hole H1'. In particular, since the etching is performed at a relatively high etching rate on the substrate 110, the depth variation may be large at the same time, and there is no etching delay layer to cause a delay of the etching of the preliminary through-hole H1', but etching of the second preliminary through-hole H2' may be delayed by the etching delay layer 120, such that the second preliminary through-hole H2' may have a depth, similar to that of the first preliminary through-hole H1'. In this case, the first etching process can be stopped. Two levels of the bottoms HB1 and HB2 may be substantially the same, or even if there is a deviation, the difference between the two levels may be 0.5 μm or less, and further, 0.3 μm or less. As described above, this level condition may be adjusted according to the type and/or thickness of the material constituting/included in the etching delay layer 120. For example, by appropriately determining the thickness of the etching delay layer 120 according to the material constituting the etch delay layer 120, the difference between the two levels may be managed in an appropriate range.

Figure 8:
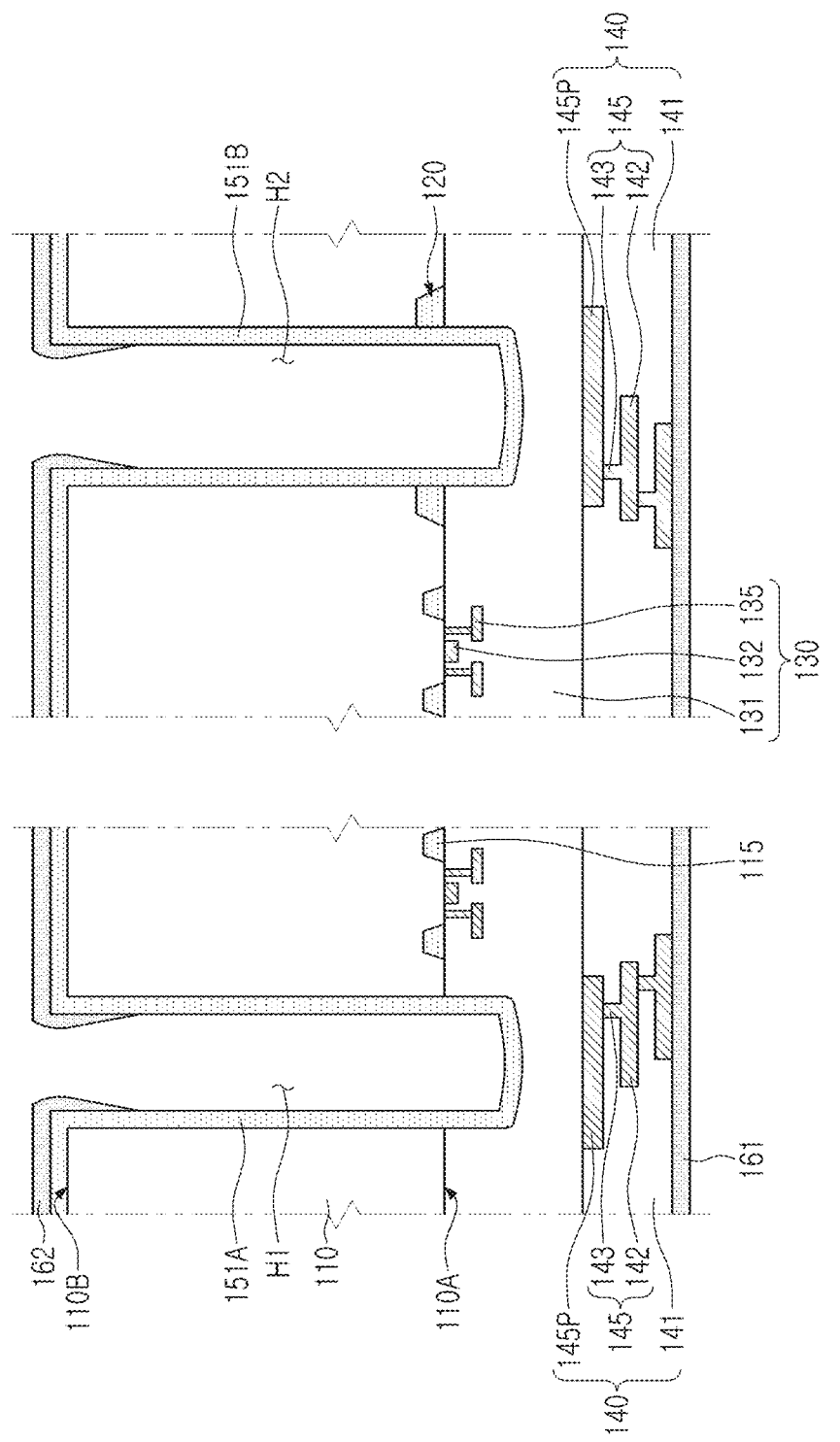

Subsequently, referring to FIG. 8, an electrode insulating film 151 conformally covering the second surface 110B of the substrate 110 and the exposed surfaces of the first and second preliminary through-holes H1' and H2' may be formed, and a protective insulating film 162 may be formed in a partial region of the electrode insulating film 151. The protective insulating film 162 may have a bread-loaf profile; however, example embodiments are not limited thereto.

The electrode insulating film 151 may be formed in side surfaces of the first and second preliminary through-holes H1' and H2' having bottoms HB1 and HB2. The electrode insulating film 151 may be formed of, e.g. may consist of or include, for example, silicon oxide, silicon nitride, silicon carbide, polymer, or a combination thereof. In some example embodiments, a chemical vapor deposition (CVD) process may be used to form the electrode insulating film 151. For example, the electrode insulating film 151 may be made of silicon oxide formed by a low pressure CVD process. For example, the electrode insulating film 151 may have a thickness of about 500 to about 3000 Å.

The protective insulating film 162 may be disposed on the second surface 110B of the substrate 110, and may extend to a portion of the electrode insulating film 151 disposed in the region of the first and second preliminary through-holes H1' and H2', adjacent to the second surface 110. The protective insulating film 162 may be used as an etching buffer layer capable of maintaining profiles of the first and second through-holes H1 and H2 of the second etching process (see FIG. 9). For example, the protective insulating film 162 may be formed of, e.g. may consist of or include, a silicon oxide layer, a silicon nitride layer, a polymer, or a combination thereof.

Figure 9:
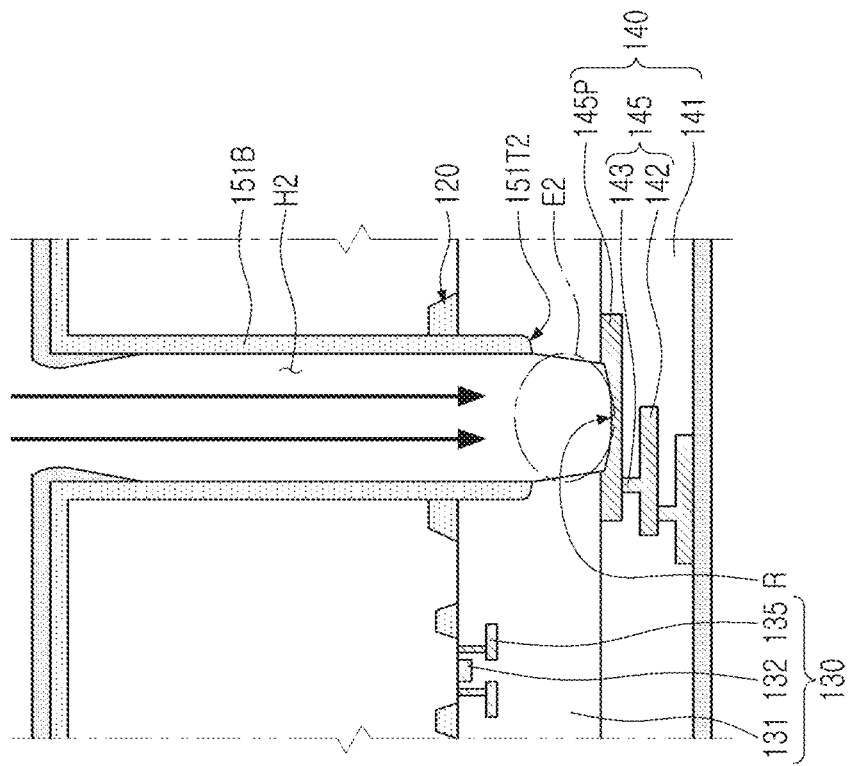

Next, referring to FIG. 9, a second etching process is performed so that the first and second preliminary through-holes H1' and H2' extend downwardly until the upper surface of the landing pad 145P is exposed, and first and second through-holes H1 and H2 are formed.

Portions of the electrode insulating film 151 and the interlayer insulating film 131 disposed at the bottoms HB1 and HB2 of the first and second preliminary through-holes H1' and H2'(FIG. 8) may be removed to form first and second through-holes exposing the upper surface of the landing pad 145P. Since the second etching process is a process of removing the same or similar material layers with the same or similar thickness, the first and second through-holes H1 and H2 may be formed at the same speed, and the landing pad 145P on one side may prevent or reduce the likelihood of over-etching. The landing pad 145P may perform a function of preventing or reducing the likelihood of etching in the second etching process. This secondary etching process may be an anisotropic etching process such as a dry etching process. Profiles of upper end portions of the first and second through-holes H1 and H2 (a portion, adjacent to the second surface 110B) in the second etching process may be protected by the protective insulating film 162.

Figure 10:
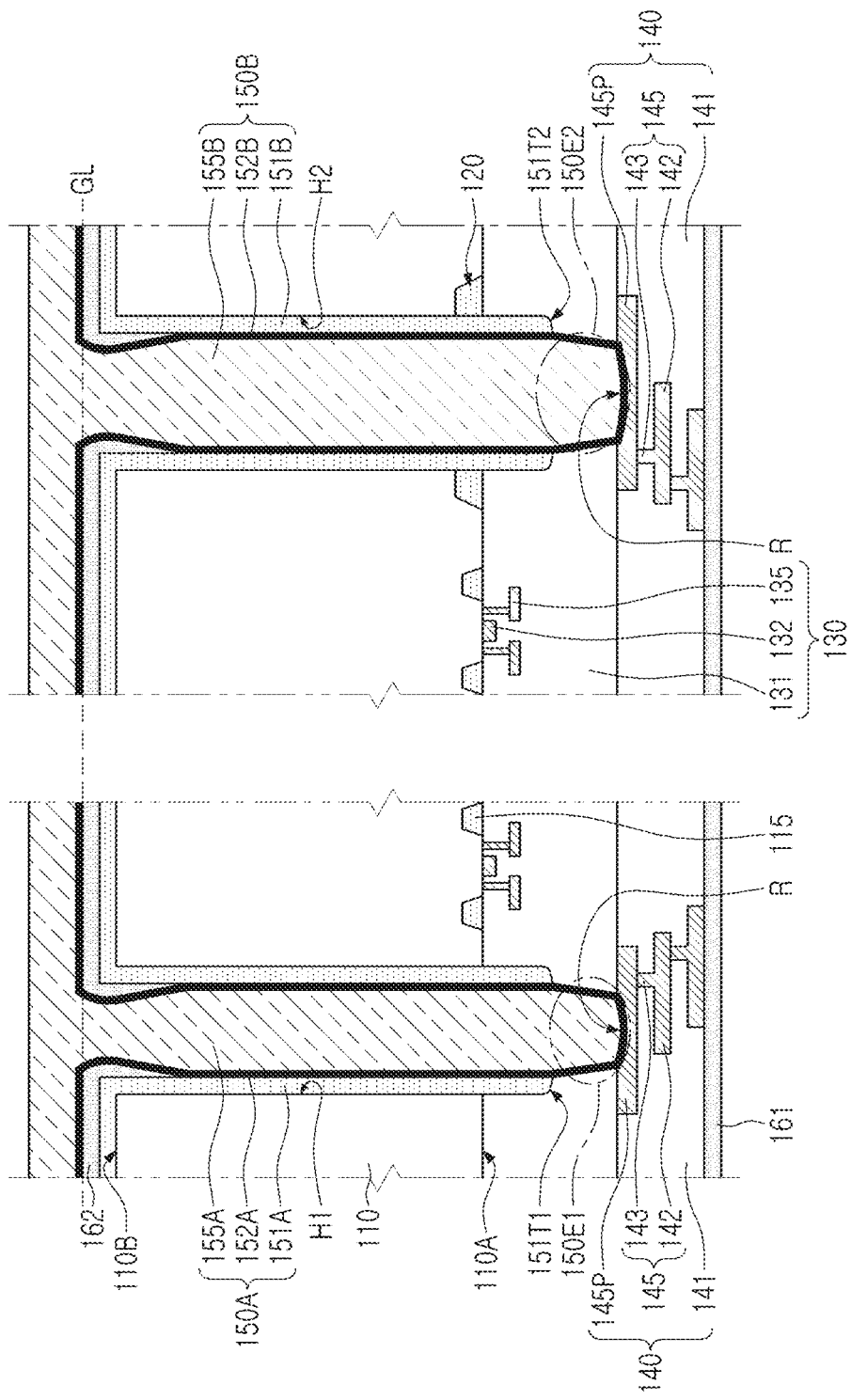

Subsequently, referring to FIG. 10, a conductive barrier layer 152 may be formed on the inner walls of the first and second through-holes H1 and H2, and then, a conductive plug 155 filling the first and second through-holes H1 and H2 on the conductive barrier 152 may be formed.

The conductive barrier 152 may be conformally formed to cover the electrode insulating film 151, exposed on sidewalls of the first and second through-holes H1 and H2, the etching delay layer 120 (second through-hole), and the interlayer insulating layer 131. Alternatively or additionally, the conductive barrier layer 152 may be conformally formed to cover a landing pad 145b exposed to bottom portions of the first and second through-holes H1 and H2. For example, the conductive barrier 152 may include at least one of W, WN, WC, Ti, TiN, Ta, TaN, Ru, Co, Mn, WN, Ni, or NiB. The conductive barrier 152 may be formed by at least one of a PVD process, an electroplating process, or an electroless plating process.

A conductive plug 155 may be formed by an electroplating process. For example, the conductive plug 155 may include at least one of Cu, CuSn, CuMg, CuNi, CuZn, CuPd, CuAu, CuRe, CuW, W, or a W alloy. Specifically, after forming a metal seed layer (not shown) on a surface of the conductive barrier 152, a conductive plug 152 filling the first and second through-holes H1 and H2 may be formed on the conductive barrier 152, by growing a metal film from the metal seed layer by an electroplating process. For example, the metal seed layer may be made of at least one of Cu, Cu alloy, Co, Ni, Ru, Co/Cu, or Ru/Cu, and the metal seed layer may be formed by a PVD process.

The first and second through electrodes 150A and 150B has first and second tapered end portions 150E1 and 150E2, respectively. The first and second tapered end portions 150E1 and 150E2 is positioned in the interlayer insulating layer 131 and adjacent to the landing pad 145P. The first and second electrode insulating films 151A and 151B are not disposed in the first and second tapered end portions 150E1 and 150E2 so as not to contact the landing pads 145P.

A resultant product including the conductive plug 155 may be polished by a chemical mechanical polishing (CMP) process to conduct conductivity until at least the protective insulating layer 162 is exposed (e.g., refer to the "GL" line), and the conductive plug 155, the conductive barrier 152, and the electrode insulating film 151 may remain in the first and second through-holes H1 and H2, thereby providing the first and second through electrodes 150A and 150B. Additionally or alternatively, an external pad 172 electrically connected to the first and second through electrodes 150 may be formed by forming a conductive layer (not shown) on the second surface 110B of the substrate 110 and patterning the conductive layer.

As described above, in some example embodiments, there may be replacement of or an addition of a new etching delay layer disposed at a level other than between the substrate and the interlayer insulating layer. Such example embodiments will be described later with reference to FIGS. 11 to 13.

Figure 11:
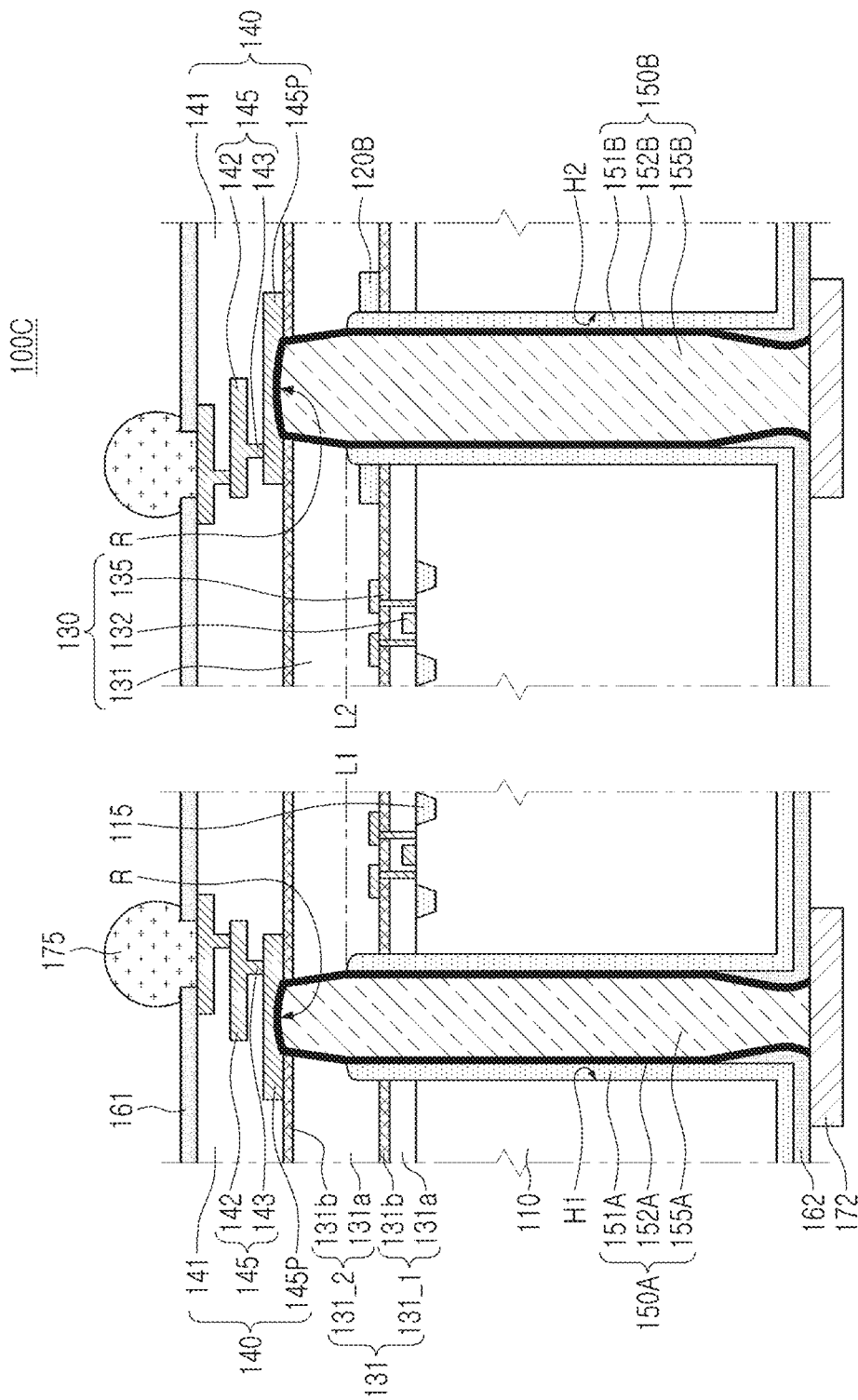
FIG. 11 is a cross-sectional view illustrating a semiconductor device according to some example embodiments of inventive concepts.

FIG. 11 is a cross-sectional view illustrating a semiconductor device according to some example embodiments of inventive concepts.

Referring to FIG. 11, it can be understood as a structure that a semiconductor device 100C according to some example embodiments has a structure, similar to the semiconductor device 100 shown in FIGS. 1 and 2 except that the etching delay layer 120B is disposed in the interlayer insulating film 131. The components of some example embodiments may be understood with reference to descriptions of the same or similar components of the semiconductor device 100 shown in FIGS. 1 and 2 unless otherwise specified.

The interlayer insulating film 131 employed in some embodiments have a multilayer structure, and may include first and second interlayer insulating films 131_1 and 131_2 stacked on the first surface 110A of the substrate 110. In some example embodiments, in the interlayer insulating film 131, a first insulating film 131a and a second insulating film 131b may be alternately stacked. For example, the interlayer insulating film 131 illustrated in FIG. 11 is illustrated as a multilayer structure including four insulating films, but inventive concepts is not limited thereto, and the number of layers to be stacked is not particularly limited. For example, the first insulating film 131a may include at least one of Tetra-Ethyl-Ortho-Silicate (TEOS) film, High Density Plasma (HDP), Boro-PhosphoSilicate Glass (BPSG), a Flowable Chemical Vapor Deposition (FCVD) oxide, or an Ultra-Low K (ULK) material having an ultra-low dielectric constant K of about 22 to 24. In some examples embodiments, the ULK material may include or consist of SiOC and/or SiCOH. The second insulating layer 131b may include silicon nitride or silicon oxynitride, but inventive concepts are not limited thereto.

The etching delay layer 120B employed in some example embodiments may be disposed in the interlayer insulating film 131, unlike the previous example embodiment. In some example embodiments, the etching delay layer 120B may be disposed on the second insulating film 131b of the first interlayer insulating film 131_1. For example, the etching delay layer 120B may be disposed between the second insulating film 131b of the first interlayer insulating film 131_1 and the first insulating film 131a of the second interlayer insulating film 131_2. For example, the etching delay layer 120B may include at least one of a dielectric material, a semiconductor material (e.g., SiGe), or a metal material (e.g., tungsten). The dielectric material may be at least one of silicon oxide, silicon nitride, silicon oxynitride, silicon carbonitride, and silicon oxycarbonitride. In some example embodiments, the etching delay layer 120B may be formed of the same material as other components formed at the same level. For example, when a capacitor is disposed therearound, when a metal material (e.g., tungsten (W)) for the capacitor is formed, the etching delay layer 120B may also be formed of the same metal material.

Figure 12:
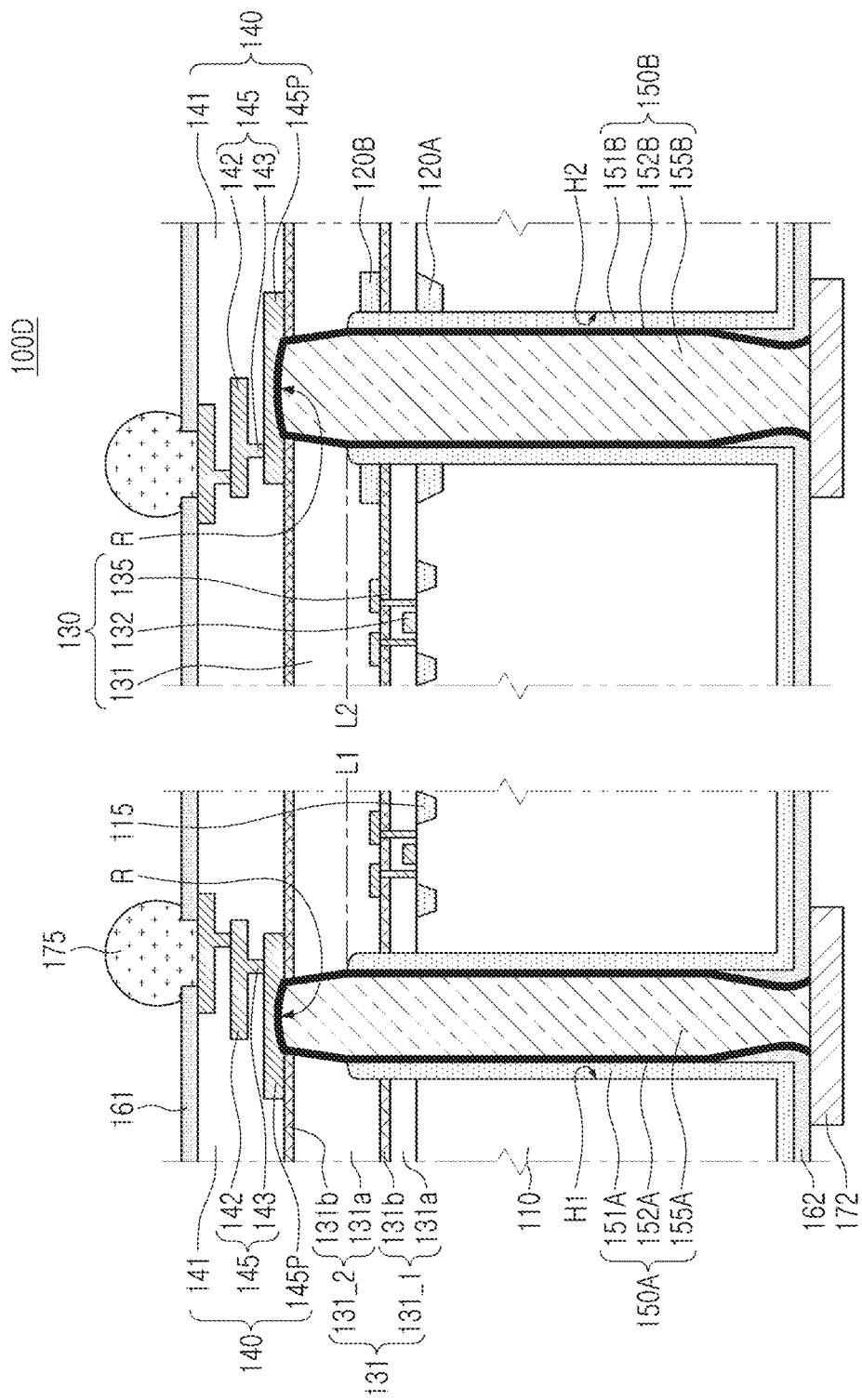
FIG. 12 is a cross-sectional view illustrating a semiconductor device according to some example embodiments of inventive concepts.

FIG. 12 is a cross-sectional view illustrating a semiconductor device according to some example embodiments of inventive concepts.

Referring to FIG. 12, it can be understood that the semiconductor device 100D according to some example embodiments has a structure, similar to the semiconductor device 100 illustrated in FIGS. 1 and 2 except that a plurality of etching delay layers 120A and 120B are employed. The components of some example embodiments may be understood with reference to descriptions of the same or similar components of the semiconductor device 100 shown in FIGS. 1 and 2 unless otherwise specified.

Similar to example embodiments shown in FIG. 11, the interlayer insulating film 131 employed in some example embodiments may include first and second interlayer insulating films 131_1 and 131_2 stacked on the first surface 110A of the substrate 110. In some example embodiments, in the interlayer insulating film 131, a first insulating film 131a and a second insulating film 131b may be alternately stacked.

The etching delay layer employed in some example embodiments may include a first etching delay layer 120A disposed between the substrate 110 and the interlayer insulating film 131, and a second etching delay layer 120B disposed in the interlayer insulating film 131. The first etching delay layer 120A may be understood in more detail with reference to the etching delay layer 120 of the example embodiment illustrated in FIGS. 1 and 2, and the second etching delay layer 120B may be understood in more detail with reference to the etching delay layer 120B of the example embodiment illustrated in FIG. 11.

The second through electrode 150B may be disposed to penetrate through the second etching delay layer 120B together with the first etching delay layer 120A. In forming a through-hole by the first etching, since the two etching delay layers 120A and 120B may be used, it is possible to greatly reduce a variation in depths of the through-holes for the first and second through electrodes 150A and 150B.

Figure 13:
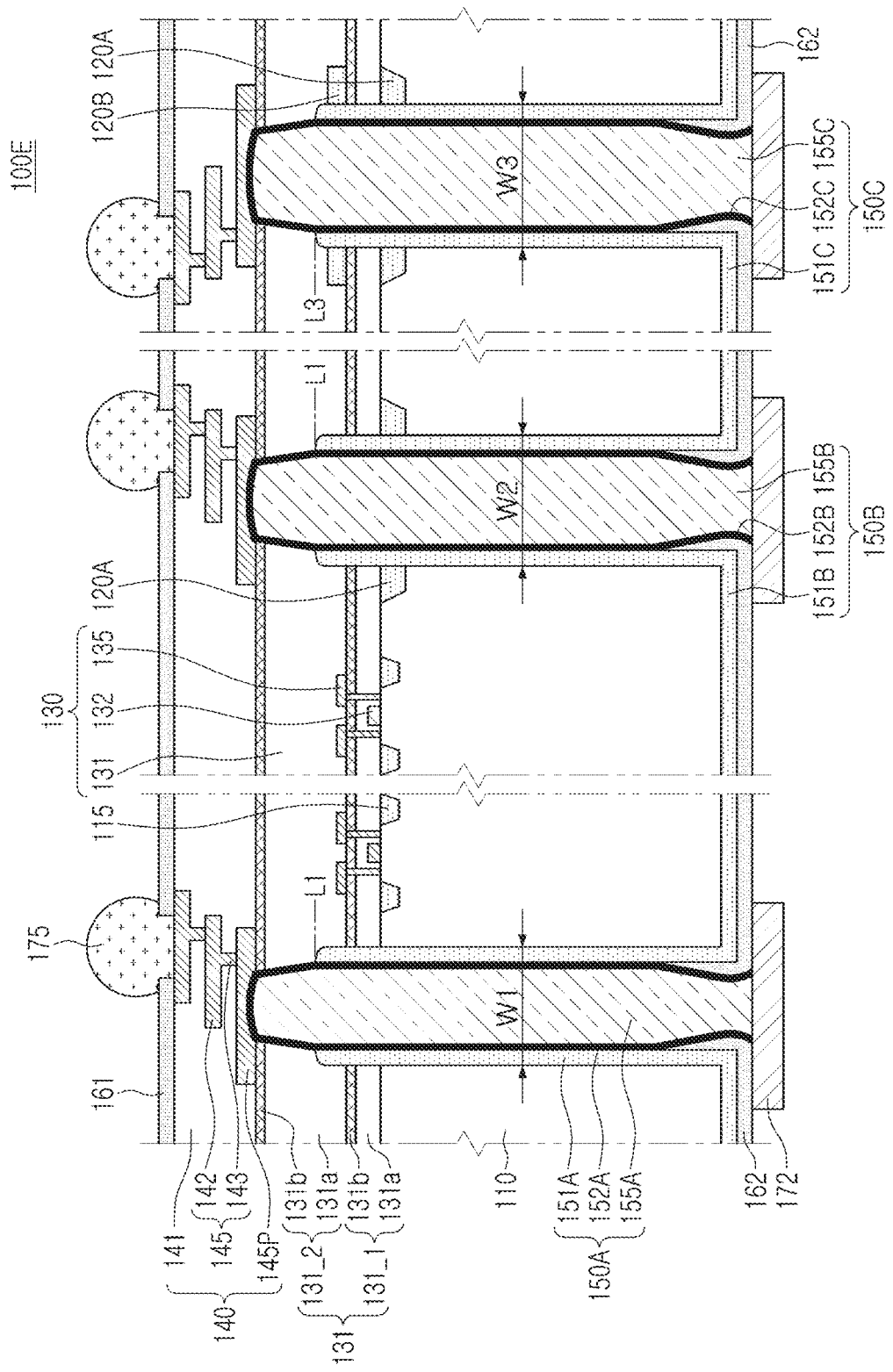
FIG. 13 is a cross-sectional view illustrating a semiconductor device according to some example embodiments of inventive concepts.

FIG. 13 is a cross-sectional view illustrating a semiconductor device according to some example embodiments of inventive concepts.

Referring to FIG. 13, a semiconductor device 100E according to some example embodiments has first to third through electrodes 150A, 150B and 150C having different widths W1, W2, and W3. The components of some example embodiments may be understood with reference to descriptions of the same or similar components of the semiconductor device 100 shown in FIGS. 1 and 2 unless otherwise specified.

Specifically, the first through electrode 150A may have a first width W1, the second through electrode 150B has a second width W2, greater than the first width W1, and the third through electrode 150C may have a third width W3, greater than the second width W2. The difference in widths between the first to third through electrodes 150A, 150B and 150C may be 1 μm or more, and further 1.5 μm or more.

The etching delay layer employed in some example embodiments includes two first etching delay layers 120A disposed on two regions of the substrate 110 and one second etching delay layer 120B disposed in the interlayer insulating film 131. The first through electrode 150A may penetrate through the substrate 110 and the interlayer insulating film 131 and be connected to a first landing pad 145P. The second through electrode 150B may penetrate through the substrate 110, one first etching delay layer 120A, and the interlayer insulating film 131 and connected to a second landing pad 145P, and the third through electrode 150C may penetrate through the substrate 110, the first and second etching delay layers 120A and 120B, and the interlayer insulating film 131 to be connected to a third landing pad 145P.

Similar to other example embodiments, the first to third through electrodes 150A, 150B, and 150C may include first to third tapered end portions disposed in the interlayer insulating film 131, respectively, and having a cross-sectional shape narrowing closer to the first to third land pads 145P. Points L1, L2, and L3 at which the first to third tapered end portions start in each of the first to third through electrodes 150A, 150B, and 150C may be at the same level, or even if there is a difference in levels, a maximum level difference may be 0.5 μm or less, and further, 0.3 μm or less. The points L1, L2, and L3 at which the first to third tapered end portions start may be represented as levels of upper ends of the first to third electrode insulating films 151A, 151B, and 151C, respectively. The levels L1, L2, and L3 of upper ends of the first to third electrode insulating films 151A, 151B and 151C in each of the first to third through electrodes 150A, 150B, and 150C, may be at the same level, or even if there is a difference in level, a maximum level difference may be 0.5 μm or less, and further, 0.3 μm or less.

As set forth above, according to inventive concepts, even if through electrodes having different critical dimensions/diameters are introduced, defects such as pad opening defects and/or the like can be prevented or reduced in likelihood of occurring, when forming the same through-hole. Alternatively or additionally, occurrence of an overhang structure caused by stopping etching in the substrate region may be prevented or reduced in likelihood of occurrence.

While some example embodiments have been shown and described above, it will be apparent to those of ordinary skill in the art that modifications and variations could be made without departing from the scope of inventive concepts as defined by the appended claims.

What is claimed is:

1. A semiconductor device comprising:
a substrate having a first surface and a second surface, opposite to the first surface, a plurality of circuits on the first surface;
an interlayer insulating film on the first surface of the substrate;
an etching delay layer in a region between the first surface of the substrate and the interlayer insulating film;
first and second landing pads on the interlayer insulating film;
a first through electrode penetrating the substrate and the interlayer insulating film, and connected to the first landing pad;
a first electrode insulating film surrounding a sidewall of the first through electrode;
a second through electrode penetrating the substrate, the etching delay layer, and the interlayer insulating film, and connected to the second landing pad, the second through electrode having a width greater than a width of the first through electrode; and
a second electrode insulating film surrounding a sidewall of the second through electrode,
wherein the first and second through electrodes respectively comprise first and second tapered end portions in the interlayer insulating film,
each of the first and second tapered end portions has a cross-sectional shape narrowing closer to the respective ones of the first and second landing pads, and
the first and second electrode insulating films partially extend into the interlayer insulating film such that outer surfaces of the first and second through electrodes are in contact with the interlayer insulating layer in the first and second tapered end portions.

2. The semiconductor device of claim 1, wherein points at which the first and second tapered end portions start in each of the first and second through electrodes are at substantially the same level.

3. The semiconductor device of claim 1, wherein a difference in levels between points at which the first and second tapered end portions start in respective ones of the first and second through electrodes is 0.5 μm or less.

4. The semiconductor device of claim 1, wherein a point at which the first tapered end portion starts in the first through electrode is at a higher level than a point at which the second tapered end portion starts in the second through electrode.

5. The semiconductor device of claim 1, wherein the second through electrode has a width of at least 1 μm greater than the width of the first through electrode.

6. The semiconductor device of claim 1, wherein the first through electrode comprises a first conductive plug, and the first electrode insulating film surrounding a sidewall of the first conductive plug in a region that excludes the first tapered end portion, and
the second through electrode comprises a second conductive plug and the second electrode insulating film surrounding a sidewall of the second conductive plug in a region that excludes the second tapered end portion.

7. The semiconductor device of claim 6, wherein the first through electrode further comprises a first conductive barrier between the first electrode insulating film and the first conductive plug and extending along a surface of the first tapered end portion, and
the second through electrode further comprises a second conductive barrier between the second electrode insulating film and the second conductive plug and extending along a surface of the second tapered end portion.

8. The semiconductor device of claim 6, further comprising:
a protective insulating film on the second surface of the substrate, and extending in partial regions between (A) the first conductive plug and the first electrode insulating film and (B) the second conductive plug and the second electrode insulating film.

9. The semiconductor device of claim 1, further comprising:
at least one additional etching delay layer disposed in the interlayer insulating film, and penetrated by the second through electrode.

10. The semiconductor device of claim 9, wherein at least one of the etching delay layer and the additional etching delay layer comprises a material selected from a group including silicon oxide, silicon nitride, silicon oxynitride, silicon carbonitride, and silicon oxycarbonitride.

11. The semiconductor device of claim 9, wherein at least one of the etching delay layer and the additional etching delay layer comprises a metal material.

12. A semiconductor device, comprising:
a substrate having an upper surface on which a plurality of circuits are arranged;
an etching delay layer on the substrate;
an interlayer insulating film on the substrate;
first and second landing pads on the interlayer insulating film;
a first through electrode penetrating the substrate and the interlayer insulating film and connected to the first landing pad;
a first electrode insulating film surrounding a sidewall of a portion of the first through electrode in the interlayer insulating film that excludes a first tapered end portion, the first tapered end portion in the interlayer insulating film and adjacent to the first landing pad;
a second through electrode penetrating through the substrate, the etching delay layer, and the interlayer insulating film, and connected to the second landing pad, the second through electrode having a width greater than or equal to 30% of the first through electrode; and
a second electrode insulating film surrounding a sidewall of a portion of the second through electrode in the interlayer insulating film, excluding a second tapered end portion, the second tapered end portion in the interlayer insulating film adjacent to the second landing pad,
wherein a difference in levels between an upper end of the first electrode insulating film and an upper end of the second electrode insulating film is 0.5 μm or less, and
wherein the first and second electrode insulating films partially extend into the interlayer insulating film such that outer surfaces of the first and second through electrodes are in contact with the interlayer insulating layer in the first and second tapered end portions.

13. The semiconductor device of claim 12, wherein each of the first and second tapered end portions has a cross-sectional shape narrowing closer to respective ones of the first and second landing pads.

14. The semiconductor device of claim 12, wherein the etching delay layer comprises a first etching delay layer in one region between the first surface of the substrate and the interlayer insulating film,
the substrate comprises a device isolation film between the plurality of circuits, and the first etching delay layer comprises the same material as the device isolation film.

15. The semiconductor device of claim 14, wherein the etching delay layer further comprises a second etching delay layer in the interlayer insulating film.

16. The semiconductor device of claim 15, wherein the second etching delay layer comprises the same material as other components in the interlayer insulating film.

17. The semiconductor device of claim 15, wherein the second etching delay layer comprises a plurality of second etching delay layers spaced apart from each other in a thickness direction of the interlayer insulating film in the interlayer insulating film.

18. The semiconductor device of claim 12, wherein the first through electrode corresponds to a signal line, and the second through electrode corresponds to a power line.

19. A semiconductor device, comprising:
a substrate;
a first etching delay layer on one region of the substrate;
an interlayer insulating film on the substrate;
a second etching delay layer in the interlayer insulating film;
first to third landing pads on the interlayer insulating film;
a first through electrode penetrating the substrate and the interlayer insulating film and connected to the first landing pad;
a first electrode insulating film surrounding a sidewall of the first through electrode;
a second through electrode penetrating the substrate, at least one of the first and second etching delay layers, and the interlayer insulating film, and connected to the second landing pad, the second through electrode having a width greater than the width of the first through electrode;
a second electrode insulating film surrounding a sidewall of the second through electrode,
third through electrode penetrating the substrate, the first and second etching delay layers, and the interlayer insulating film, and connected to the third landing pad, the third through electrode having a width greater than the width of the second through electrode; and
a third electrode insulating film surrounding a sidewall of the third through electrode,
wherein the first to third through electrodes respectively comprise first to third tapered end portions positioned in the interlayer insulating film and each of first to third tapered end portions has a cross-sectional shape narrowing closer to respective ones of the first to third landing pads, and
the first, second, and third electrode insulating films partially extend into the interlayer insulating film such that outer surfaces of the first, second, and third through electrodes are in contact with the interlayer insulating layer in the first, second, and third tapered end portions.

20. The semiconductor device of claim 19, wherein a level difference between points at which the first to third tapered end portions start in each of the first to third through electrodes is 0.5 μm or less.

* * * * *